United States Patent
Hiblot et al.

(10) Patent No.: US 11,114,337 B2
(45) Date of Patent: Sep. 7, 2021

(54) METHOD FOR BONDING AND INTERCONNECTING SEMICONDUCTOR CHIPS

(71) Applicant: IMEC VZW, Leuven (BE)

(72) Inventors: Gaspard Hiblot, Leuven (BE); Julien Jussot, Kessel-Lo (BE); Geert Van der Plas, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/716,025

(22) Filed: Dec. 16, 2019

(65) Prior Publication Data
US 2020/0203224 A1 Jun. 25, 2020

(30) Foreign Application Priority Data
Dec. 19, 2018 (EP) .................... 18213852

(51) Int. Cl.
*H01L 21/768* (2006.01)
*H01L 23/538* (2006.01)
(Continued)

(52) U.S. Cl.
CPC .. *H01L 21/76877* (2013.01); *H01L 21/76802* (2013.01); *H01L 23/5384* (2013.01);
(Continued)

(58) Field of Classification Search
CPC combination set(s) only.
See application file for complete search history.

(56) References Cited

U.S. PATENT DOCUMENTS 5,609,925 A 3/1997 Camilletti et al.
9,219,047 B2 * 12/2015 Motoyoshi .......... H01L 25/0657
(Continued)

FOREIGN PATENT DOCUMENTS

EP 3 035 369 A1 6/2016
WO WO 2010/141351 A2 12/2010
WO WO 2011/130693 A2 10/2011

OTHER PUBLICATIONS

Chung, et al., "Seamless On-Wafer Integration of Si(100) MOSFETs and GaN HEMTs", IEEE Electron Device Letters, vol. 30, No. 10, Oct. 2009, pp. 1015-1017.
(Continued)

*Primary Examiner* — Mamadou L Diallo
(74) *Attorney, Agent, or Firm* — Knobbe, Martens, Olson & Bear, LLP

(57) ABSTRACT

A method is provided for bonding and interconnecting two semiconductor chips arranged on semiconductor substrates. HSQ (Hydrogen Silsesquioxane) or an equivalent material is used as a bonding layer and after bonding and thinning one of the wafers (or first thinning and then bonding), the bond layer is locally irradiated by an e-beam through the thinned substrate, thereby locally transforming the bonding material into silicon oxide. Then a via opening is etched through the thinned substrate and an etch process selectively removes the oxide from an area delimited by the bonding material or vice versa. The filling of the via opening establishes an electrical connection between the bonded wafers, that is equivalent to a connection obtained by hybrid bonding, but that does not suffer from the disadvantages thereof.

10 Claims, 8 Drawing Sheets

(51) Int. Cl.
*H01L 23/00* (2006.01)
*H01L 25/065* (2006.01)

(52) U.S. Cl.
CPC .............. *H01L 24/05* (2013.01); *H01L 24/67* (2013.01); *H01L 24/94* (2013.01); *H01L 25/0657* (2013.01); *H01L 2924/14* (2013.01)

(56) References Cited

U.S. PATENT DOCUMENTS

| | | | | |
|---|---|---|---|---|
| 2004/0253803 | A1* | 12/2004 | Tomono | H01L 24/11 438/614 |
| 2010/0181686 | A1* | 7/2010 | Sugino | H01L 25/105 257/777 |
| 2014/0191375 | A1 | 7/2014 | Hartley et al. | |
| 2015/0097258 | A1 | 4/2015 | Shigetoshi | |
| 2015/0348917 | A1 | 12/2015 | Tsai et al. | |
| 2016/0049294 | A1 | 2/2016 | Chang et al. | |
| 2016/0343763 | A1* | 11/2016 | Kagawa | H01L 27/14625 |
| 2016/0351135 | A1* | 12/2016 | Sampsell | G09G 3/20 |
| 2017/0186627 | A1* | 6/2017 | Chylak | H01L 25/0657 |
| 2019/0164899 | A1* | 5/2019 | Hu | H01L 21/76816 |
| 2020/0126963 | A1* | 4/2020 | Lee | H01L 33/62 |
| 2020/0135677 | A1* | 4/2020 | Chang | H01L 23/147 |
| 2020/0144232 | A1* | 5/2020 | Chae | H01L 25/0756 |
| 2020/0152691 | A1* | 5/2020 | Lee | H01L 33/62 |
| 2020/0203432 | A1* | 6/2020 | Rachmady | H01L 51/102 |

OTHER PUBLICATIONS

Coquand, et al., "On the optimization of ebeam lithography using Hydrogen SilsesQuioxane (HSQ) for innovative self-aligned CMOS process", Abstract #866, 223rd ECS Meeting, © 2013 The Electrochemical Society.

Gaben, et al., "Evaluation of Stacked Nanowires Transistors for CMOS: Performance and Technology Opportunities", ECS Transactions, 72 (4) 43-54 (2016).

Monfray, et al., "A solution for an ideal Planar Multi-Gates Process for ultimate CMOS?", IEDM10-257, 978-1-4244-7419-6/10/$26.00 © 2010 IEEE.

Weber, et al., "Electron beam lithography for nanometer-scale planar double-gate transistors", Microelectronic Engineering 78-79 (2005) 206-211.

Choi et al., "Comparative study of thermally cured and electron-beam-exposed hydrogen silsesquioxane resists", J. Vac. Sci. Technol. B, vol. 26, No. 5, Sep./Oct. 2008, pp. 1654-1659.

* cited by examiner

METHOD FOR BONDING AND INTERCONNECTING SEMICONDUCTOR CHIPS

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 18213852.9, filed on Dec. 19, 2018. The aforementioned application is incorporated by reference herein in its entirety, and is hereby expressly made a part of this specification.

FIELD OF THE INVENTION

The 3D-integration of semiconductor integrated circuit chips, i.e. to the production of stacked interconnected chips, by bonding of device wafers is provided.

STATE OF THE ART

Various approaches for stacked 3D integration have been studied and developed. A favoured approach involves the bonding of fully processed device wafers followed by the formation of the electrical interconnection of the devices on the respective wafers by Through Semiconductor Via (TSV) connections formed by etching through a thinned device wafer. This particular process flow is often referred to as the 'TSV via-last flow'. In the TSV via-last flow, the two current bonding options are:
1) dielectric bonding, in which case uniform dielectric bonding layers are applied to the two wafers which are brought into contact to form the wafer stack, followed by an annealing step to establish the bond between the dielectric bonding layers. In this case, the two wafers are contacted from the top of the stack through different types of TSV (deep and shallow).
2) hybrid bonding, in which case the bonding interface comprises metal pads embedded in dielectric bonding layers applied on the two wafers, which enables the formation of electrical connections between the two wafers, while a single type of TSV is sufficient to connect the wafers to the top of the stack.

Option 1 (dielectric bonding) is challenging for TSV processing by lithography and etching, since it requires the etch to be compatible with both types of TSV (deep and shallow) or if this is not possible, the approach requires different reticles, which is costly. Option 2 (hybrid bonding) is challenging from the bonding perspective since two different materials are present at the interface: metal and dielectric. This may cause errors in terms of the alignment of the metal pads due to non-uniform wafer deformations occurring during the bonding process. Another problem is related to the preparation of the bonding surfaces for hybrid bonding. This is typically done by damascene processing, which includes chemical mechanical polishing (CMP), in order to obtain for example Cu conductors embedded in $SiO_2$. It is however difficult to obtain a very flat surface due to the Cu recess below the $SiO_2$ surface during CMP. As a result, the hybrid bonding surface is not perfectly flat, leading to an inferior quality of the bond.

SUMMARY OF THE INVENTION

A method is provided that suffers from neither of the above-described disadvantages. This aim is achieved by the methods disclosed in the appended claims. The embodiments are related to a method for bonding and interconnecting two semiconductor chips arranged on substrates such as silicon wafers. The embodiments take advantage of a number of known characteristics of the class of compounds known as Hydrogen Silsesquioxane (HSQ) and materials equivalent to HSQ, in order to solve the above shortcomings of the prior art. HSQ or its equivalent is used as a bonding layer for bonding two device wafers, and after bonding and thinning one of the wafers (or first thinning and then bonding), the bond layer is locally irradiated by an e-beam through the thinned wafer, thereby locally transforming the bonding material into silicon oxide. Then a via opening is etched through the thinned wafer and an etch process selectively removes the oxide from an area delimited by the bonding material or vice versa. The filling of the via opening establishes an electrical connection between the bonded wafers, that is equivalent to a connection obtained by hybrid bonding, but that does not suffer from the disadvantages thereof.

According to a first embodiment, a method is provided for bonding a first semiconductor chip on a first substrate to a second semiconductor chip on a second substrate, comprising the steps of:
- providing a bonding layer on at least one of the substrates, the bonding layer being formed of a dielectric bonding material, wherein the dielectric material is Hydrogen Silsesquioxane (HSQ), or an equivalent thereof,
- bonding the first substrate to the second substrate and performing a thermal annealing step, so as to obtain a stack of the substrates with a bond layer between the substrates, wherein
- the first substrate is thinned either before or after the bonding step,
- the thermal annealing step takes place at a temperature below a temperature at which the bonding material transforms into silicon oxide,
- after bonding, an electron beam is scanned across an area of the thinned substrate, the energy of the electron beam being sufficient for the beam to reach the bond layer and to transform the scanned bonding material of the bond layer into a silicon oxide, to thereby obtain a volume of the bond layer that is transformed into a silicon oxide, wherein said volume is essentially a closed wall extending over the full thickness of the bond layer, and enclosing a volume of bonding material, thereby separating that volume of bonding material from the rest of the bond layer,
- a via opening is etched through the thinned substrate until reaching the interior of the closed wall, and a dielectric liner is formed on the sidewalls of the via opening,
- through the via opening, the bonding material is removed from the interior of the closed wall, selectively with respect to the silicon oxide, so as to create a cavity in the bond layer and expose a conductor in the second substrate,
- the cavity and the via opening are filled with an electrically conductive material, to thereby form an electrical connection that connects the conductor in the second substrate to a conductor present in the first substrate and/or to a contact present on top of the stack.

After the removal of the bonding material from the interior of the closed wall, the stack may be subjected to an additional thermal annealing step at a temperature at or above the temperature at which the bonding material of the bond layer transforms into silicon oxide, to thereby transform the entire bond layer into silicon oxide.

According to a second embodiment, a method is provided for bonding a first semiconductor chip on a first substrate to a second semiconductor chip on a second substrate, comprising the steps of:

provviding a bonding layer on at least one of the substrates, the bonding layer being formed of a dielectric material, wherein the dielectric material is Hydrogen Silsesquioxane (HSQ), or an equivalent thereof, bonding the first substrate to the second substrate, and performing a thermal annealing step, so as to obtain a stack of the substrates with a bond layer between the substrates, wherein the first substrate is thinned either before or after the bonding step, the thermal annealing step takes place at a temperature below a temperature at which the bonding material transforms into silicon oxide, after bonding, an electron beam is scanned across an area of the thinned substrate, the energy of the electron beam being sufficient for the beam to reach the bond layer and to transform the bonding material of the bond layer into a silicon oxide, to thereby obtain a volume of the bond layer that is transformed into a silicon oxide, wherein said volume is a solid shape extending over the full thickness of the bond layer, a via opening is etched through the thinned substrate until reaching the solid shape, and a dielectric liner is formed on the sidewalls of the via opening, through the via opening, the silicon oxide of the solid shape is removed selectively with respect to the bonding material, so as to create a cavity in the bond layer and expose a conductor in the second substrate, the cavity and the via opening are filled with an electrically conductive material, to thereby form an electrical connection that connects the conductor in the second substrate to a conductor in the first substrate and/or to a contact on top of the stack.

After the removal of the silicon oxide of the solid shape, the stack may be subjected to an additional thermal annealing step at a temperature at or above the temperature at which the bonding material of the bond layer transforms into silicon oxide, to thereby transform the entire bond layer into silicon oxide.

The method according to the second embodiment may further comprise the step of applying a continuous layer onto the first substrate prior to applying the bonding layer to said first substrate, wherein an additional liner is applied on top of the liner inside the via opening, and wherein the material of said continuous layer and of the additional liner is resistant to an etch process used to remove the silicon oxide of the solid shape. The continuous layer and the additional liner may be formed of silicon nitride.

According to the first or the second embodiment, a bonding layer may be provided on the two substrates, wherein the bonding comprises a dielectric bonding step obtained by bringing the two bonding layers into physical contact, followed by the first thermal annealing step.

The embodiments are also related to a stack of two or more semiconductor chips bonded by a bond layer consisting of Hydrogen Silsesquioxane (HSQ), or an equivalent thereof, wherein at least one electrically conductive pillar extends between two adjacent chips of the stack, and wherein said pillar is embedded in the bond layer formed between said adjacent chips.

The electrically conductive pillar may form the interior of a closed silicon oxide wall extending between the adjacent chips, said wall separating the bond layer from the pillar. Alternatively, the pillar may be in direct contact with the bond layer.

DETAILED DESCRIPTION OF THE INVENTION

The term HSQ represents a class of inorganic compounds with the chemical formula $[HSiO_{3/2}]_n$. The variable n can be any suitable integer, e.g., an integer of 10 or more (e.g., 10-1000) Any compound within this class is applicable in the embodiments. Materials applicable instead of HSQ and in the same way as HSQ are partially condensed silsesquioxanes in which 2 or more long chains of $RSiO_{3/2}$ units are connected at regular intervals by Si—O—Si bonds, where R can be a hydrogen atom, an alkyl, an aryl or an alkoxy functional group. In certain embodiments, a long chain is a chain having 10 or more (e.g., 10-1000) $RSiO_{3/2}$ units. In certain embodiments, the alkyl is a $C_{1-10}$ alkyl, the aryl is a 06-14 aryl and the alkoxy is a $C_{1-10}$ alkoxy, however, in other embodiments these groups may contain a higher number of carbon atoms than specified. These alternative materials are referred to within the present context as materials "equivalent" to HSQ. The use of HSQ as a resist in e-beam lithography is well known and based on the fact that HSQ converts to a silicon oxide ($SiO_x$, e.g., wherein x can be between 1 and 2) after exposure to irradiation by an electron beam. It is known also that HSQ transforms into silicon oxide under the influence of heating above the curing temperature of the material, which is at about 400° C. These characteristics of HSQ are documented for example in "Comparative study of thermally cured and electron-beam-exposed hydrogen silsesquioxane resists", Journal of Vacuum Science & Technology B: Microelectronics and Nanometer Structures Processing, Measurement, and Phenomena 26, 1654 (2008). It is known also that HSQ may be used as an adhesive bonding material, as described for example in PCT International Publication No. WO2010/141351. The method of the embodiments will be explained on the basis of the use of HSQ, but the description is valid also for the equivalent materials.

Figure 1A:
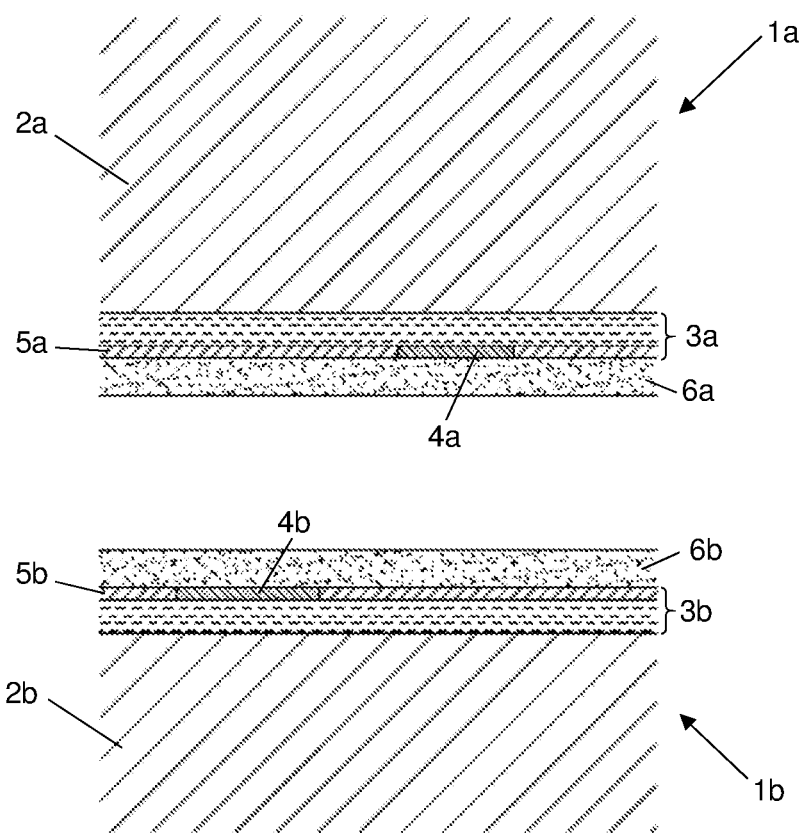
FIGS. 1A to 1H illustrate the steps of the method for bonding and interconnecting two semiconductor chips according to a first embodiment.

FIG. 1A shows the starting point of the method according to a first embodiment for bonding and interconnecting two semiconductor chips. Two wafers 1a and 1b are to be bonded. Each of the wafers comprises a semiconductor support substrate 2a and 2b, e.g. a silicon substrate, carrying a plurality of chips, which are composed of multiple active devices (transistors, diodes and/or others) arranged on the substrate according to the layout of the chips. The drawing shows a schematic cross section of a small area of the wafers 1a and 1b as they face each other before bonding. The active devices are arranged in a front end of line (FEOL) portion on the respective substrates 2a and 2b, with on top of the FEOL portion a back end of line (BEOL) portion consisting of multiple metallization levels $M_1, M_2$, etc. interconnected by via connections, for connecting the active devices to contact terminals on the chip or on the eventual chip stack. The combined FEOL and BEOL portion is represented in a simplified way by the areas 3a and 3b for the respective wafers 1a and 1b. Electrical conductors 4a and 4b are shown at the outer surface of the respective areas 3a and 3b, embedded in respective dielectric layers 5a and 5b. These layers 5a and 5b represent the upper level of the BEOL which may be the actual upper metallization layer Mn or a redistribution layer formed thereon. For the sake of explaining the embodiments, the conductors 4a/4b and outer dielectric layers 5a/5b are shown at a thickness that may be out of proportion to the real-life thickness of the FEOL and BEOL portions in a chip.

Figure 1B:
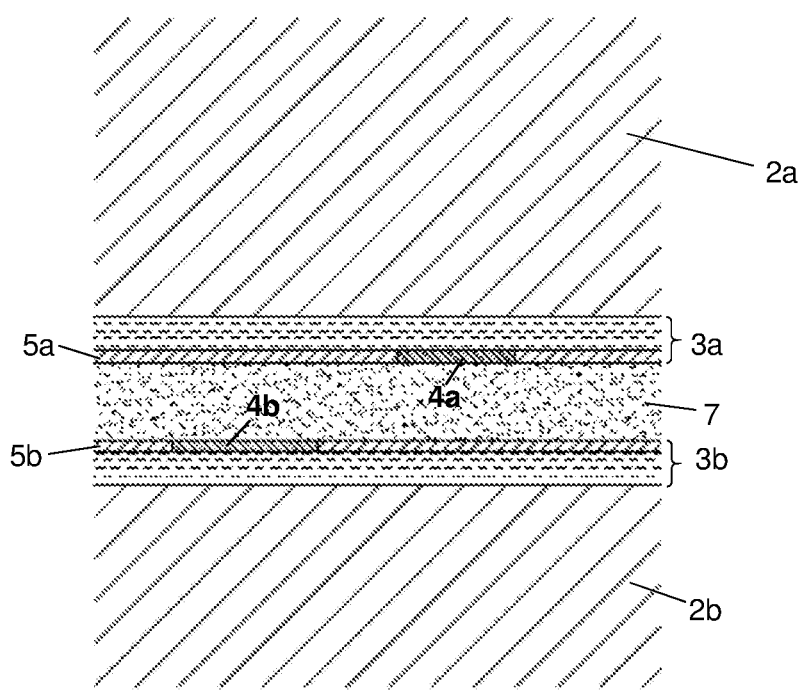
Figure 1C:
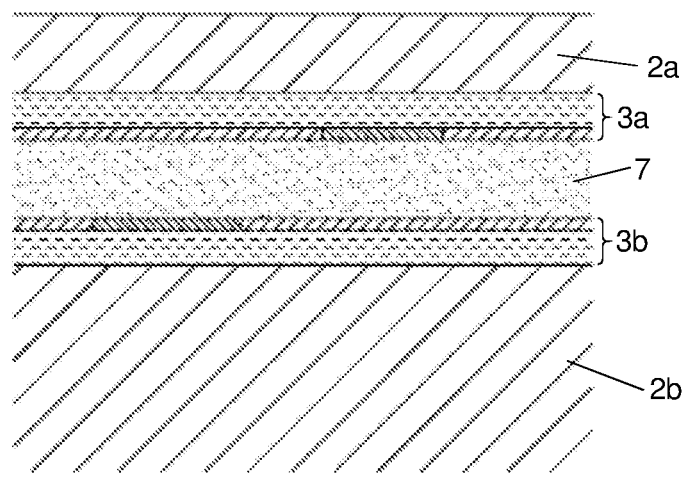

According to the embodiments, HSQ bonding layers 6a and 6b are applied on both wafers. These layers may be applied by spin coating an HSQ-containing solution onto the surface, followed by a baking step to remove the solvent, so that an essentially pure HSQ layer remains. HSQ-solutions are commercially available products and details of the above-described application process are known as such in the art. The thickness of the dried HSQ layers is preferably in the range of 100 to 500 nm. The wafers are aligned and the bonding layers 6a and 6b are brought into physical contact, followed by a thermal annealing step, at a temperature below the temperature at which HSQ transforms into silicon oxide. For example the post-bond anneal may be done at a temperature between 250° and 350° C. during a time between 10 minutes and 2 hours At these temperatures, the two HSQ layers merge to form a single HSQ bond layer 7, as in FIG. 1B.

Figure 1D:
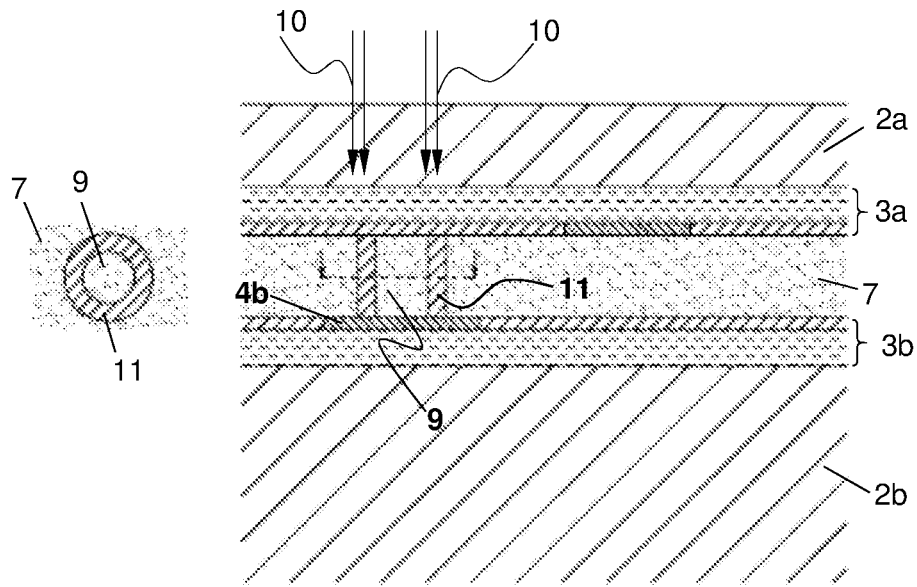

Then, as shown in FIG. 10, the top wafer 1a is thinned, which may be done by grinding and/or chemical mechanical polishing (CMP) and possibly by etching, until the support substrate 2a is reduced to a thickness which is preferably in the order of a few micrometers, for example about 2 or 3 micrometers. In the next step (FIG. 1d), the wafer assembly is irradiated with an electron beam 10 directed at the thinned substrate 2a and oriented essentially perpendicularly with respect to plane of the wafer assembly. The beam energy is selected so that the electrons penetrate the thinned upper substrate 2a and the BEOL/FEOL portion 3a, and interact with the HSQ bond layer 7 across the full thickness of the bond layer 7. The energy is furthermore chosen so as to be sufficient for transforming the HSQ material locally into silicon oxide. When the silicon substrate 2a is thinned to a few micrometers, this may be achieved by an e-beam of which the energy is in the order of 100 keV. According to the first embodiment and as shown in FIG. 1D, the e-beam is scanned over a ring-shaped area, so that the transformation of HSQ to silicon oxide is limited to a volume that essentially corresponds to a closed wall 11. The cross-section of the wall need not be circular as shown in the drawing, but may have other shapes as well. The height of the wall equals the thickness of the bond layer 7, so that the interior of the wall forms a volume 9 of HSQ material that is separated from the remainder of the bond layer 7 by the closed silicon oxide wall 11. The location of the irradiated area is chosen with respect to a conductor 4b in the lower substrate, so that the enclosed volume 9 overlies the conductor 4b.

Figure 1E:
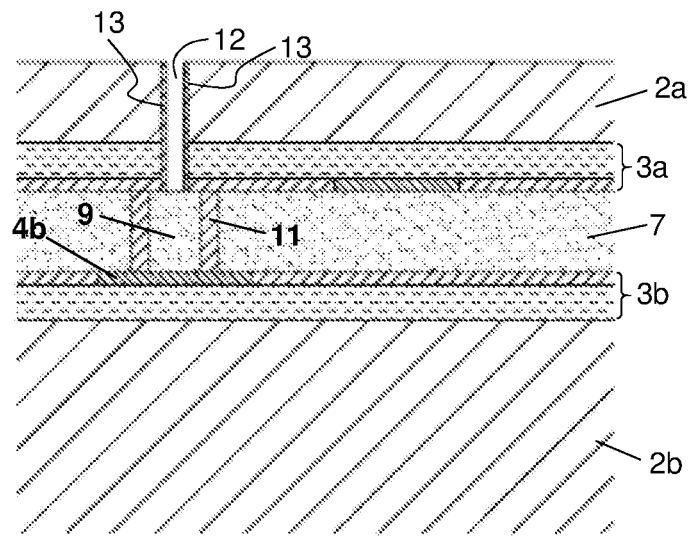

By known lithography and anisotropic etching techniques and as illustrated in FIG. 1E, a via opening 12 is then produced through the thinned upper substrate 2a and through the BEOL/FEOL portion 3a. In the drawing, the via opening 12 is concentric with the closed wall 11, but this is not a requirement. In general, the section of the via opening 12 as seen in a plane parallel to the wafer assembly, lies within the outer border of the wall 11 and overlaps at least partially the section of the HSQ volume 9 inside the wall 11 of silicon oxide. The etching of the via opening 12 continues until reaching said HSQ volume 9. Then a dielectric liner 13 is produced on the sidewalls and the bottom of the via opening, which may be done by a known process, for example by atomic layer deposition. The liner 13 may be silicon oxide. The liner is removed from the bottom of the opening, while maintaining the liner on the sidewalls, which may be done by a plasma-based etch process, as described for example in document EP3035369. The dimensions of the via opening 12 and the liner may be in accordance with known TSV-technology.

Figure 1F:
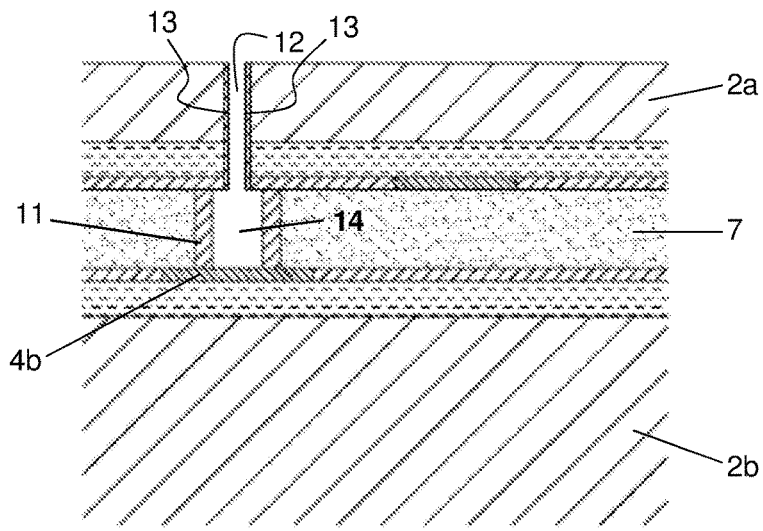
Figure 1G:
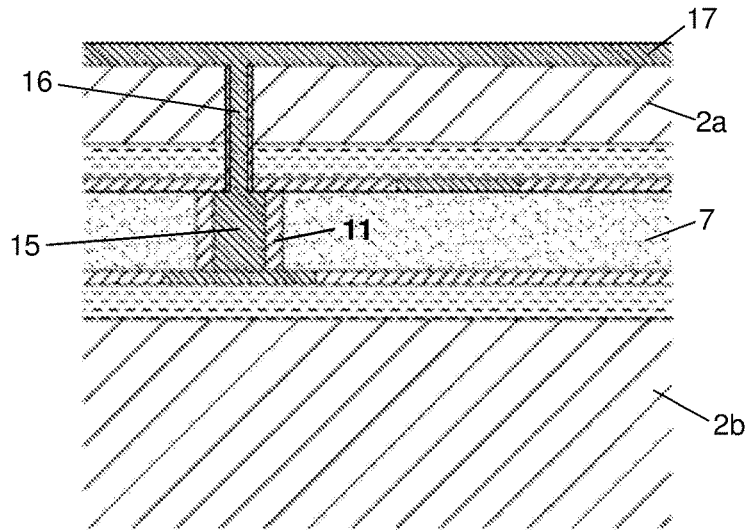
Figure 1H:
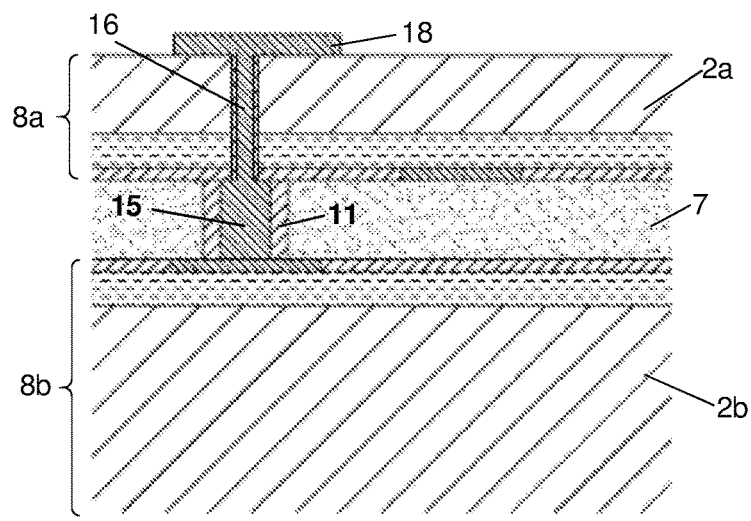

Then, as shown in FIG. 1F, the HSQ material of the enclosed volume 9 is removed by an etch process that removes the HSQ selectively with respect to the silicon oxide wall 11 and with respect to the liner 13 and the dielectric layer 5a of the BEOL portion on the thinned substrate 2a. A suitable etch process for this step is a wet etch using a TMAH solution (Tetramethylammonium Hydroxide). A cavity 14 is thereby created, that is connected to the upper surface of the wafer stack by the via opening 12. The cavity 14 and the via opening 12 are then filled with an electrically conductive material, such as copper or tungsten, see FIG. 1G, by a suitable process such as electroplating for Cu or LPCVD (Low Pressure Chemical Vapour Deposition) for W. This creates an electrical connection to the conductor 4b of the lower substrate 2a, consisting of an electrically conductive pillar 15 and a via connection 16. A blanket layer 17 of the conductive material is formed on the upper surface of the wafer stack, which may be patterned as shown in FIG. 1H, to form a contact pad 18 that allows to contact a chip on the lower wafer 1b from the top of the stack. The result is a stack of two semiconductor chips 8a and 8b of which a small portion is shown in FIG. 1H. The chips are bonded by an HSQ bond layer 7, wherein at least one electrically conductive pillar 15 extends between the two adjacent chips 8a and 8b of the stack, and wherein said pillar 15 is embedded in the bond layer 7 formed between said adjacent chips, but separated from the bond layer 7 by a closed silicon oxide wall 11 extending between the adjacent chips.

Figure 2:
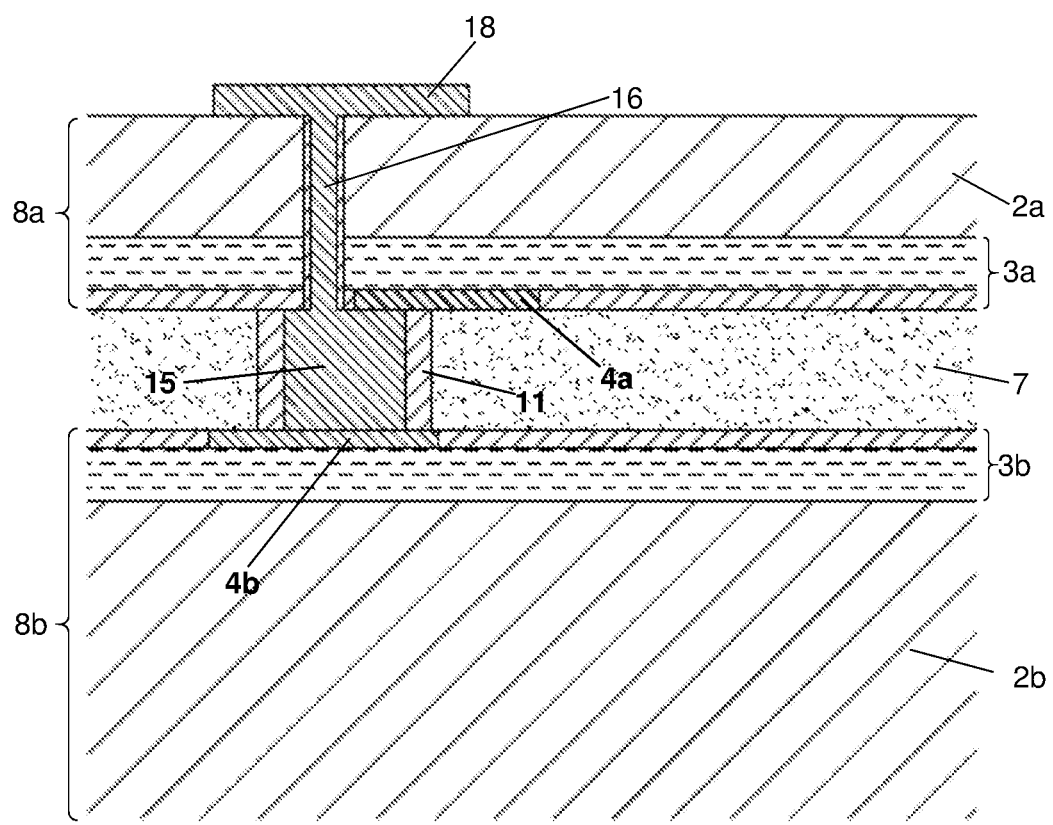
FIG. 2 illustrates the result of the method of the first embodiment applied to a case where two conductors in the back end of line of the two bonded chips are to be connected directly.

FIG. 2 illustrates how the same process allows to form a contact to both the upper and the lower chip of a stack, by irradiating a ring-shaped area that overlaps a conductor 4a on the upper substrate 2a as well as a conductor 4b on the lower substrate 2b. In both cases, FIG. 1H and FIG. 2, the result is equivalent to hybrid bonding wherein two metal pads formed on the respective bonding surfaces are in contact at the bonding interface. The method of the embodiments, however, does not suffer from the disadvantages of hybrid bonding, as the bonding process is in fact a direct dielectric bonding process that establishes a bond between two uniform layers, in this case HSQ layers. So the method of the embodiments combines the advantages of the two existing options highlighted in the introduction, without incurring the respective disadvantages.

Figure 3A:
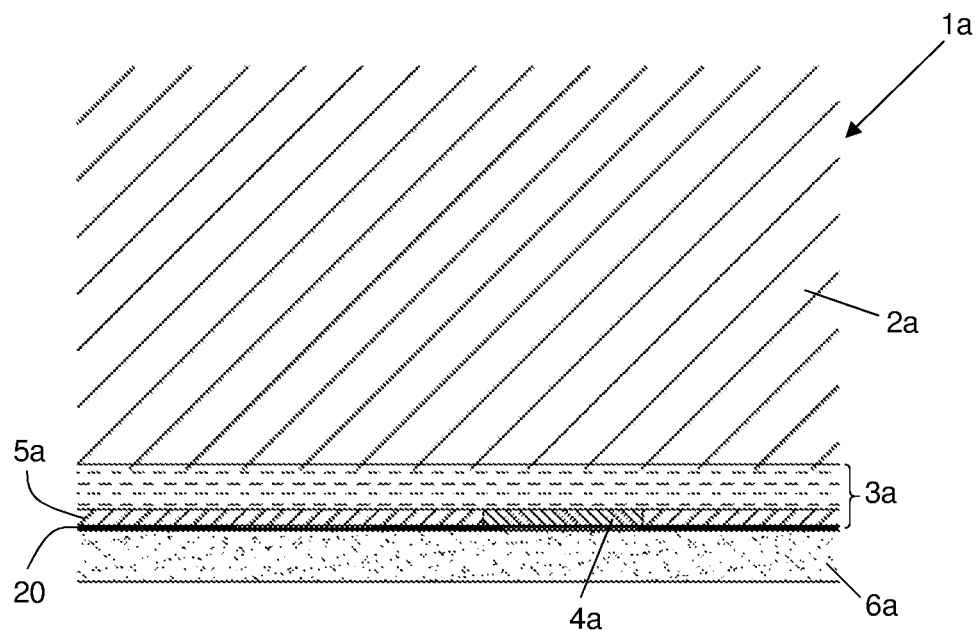
FIGS. 3A to 3E illustrate the steps of the method for bonding and interconnecting two semiconductor chips according to a second embodiment.
Figure 3A:
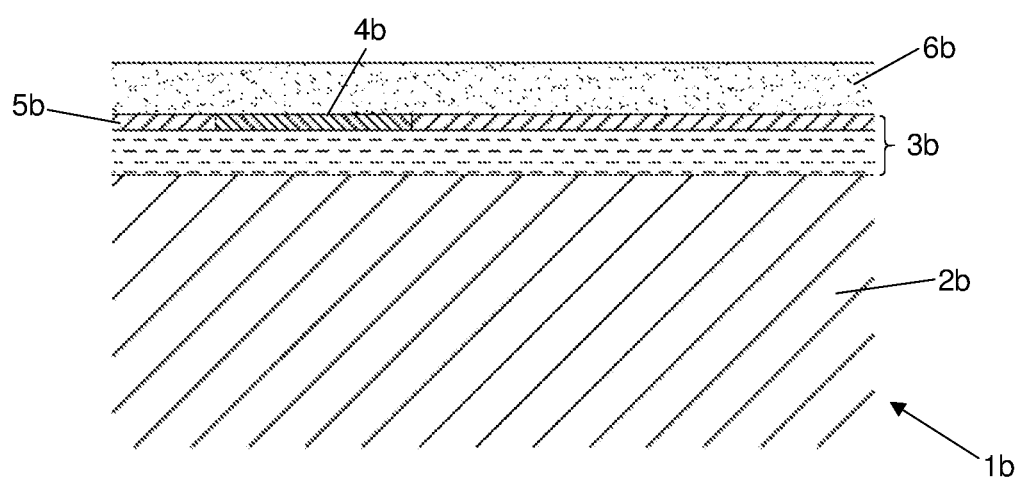
Figure 3B:
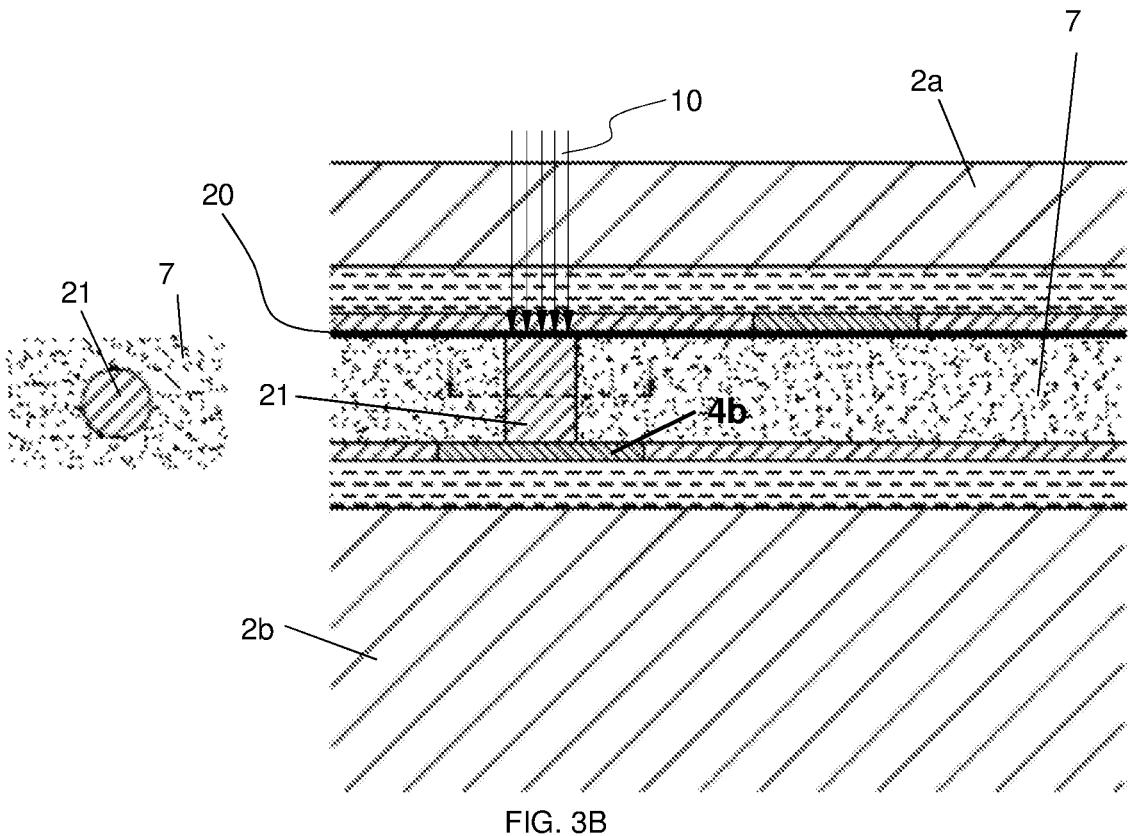
Figure 3C:
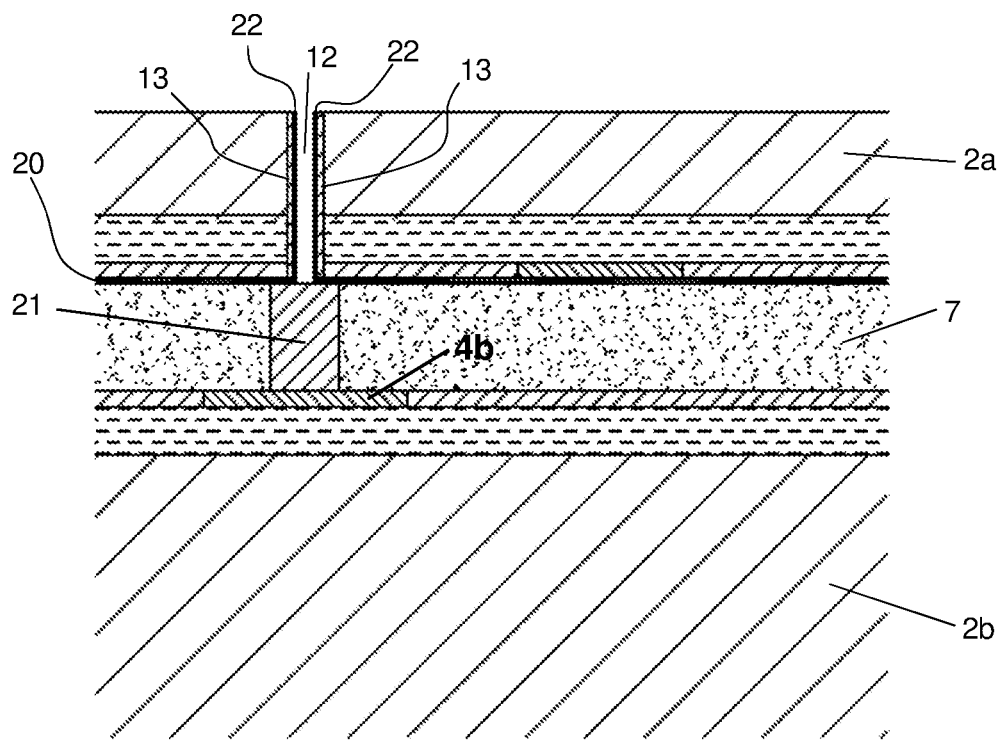
Figure 3D:
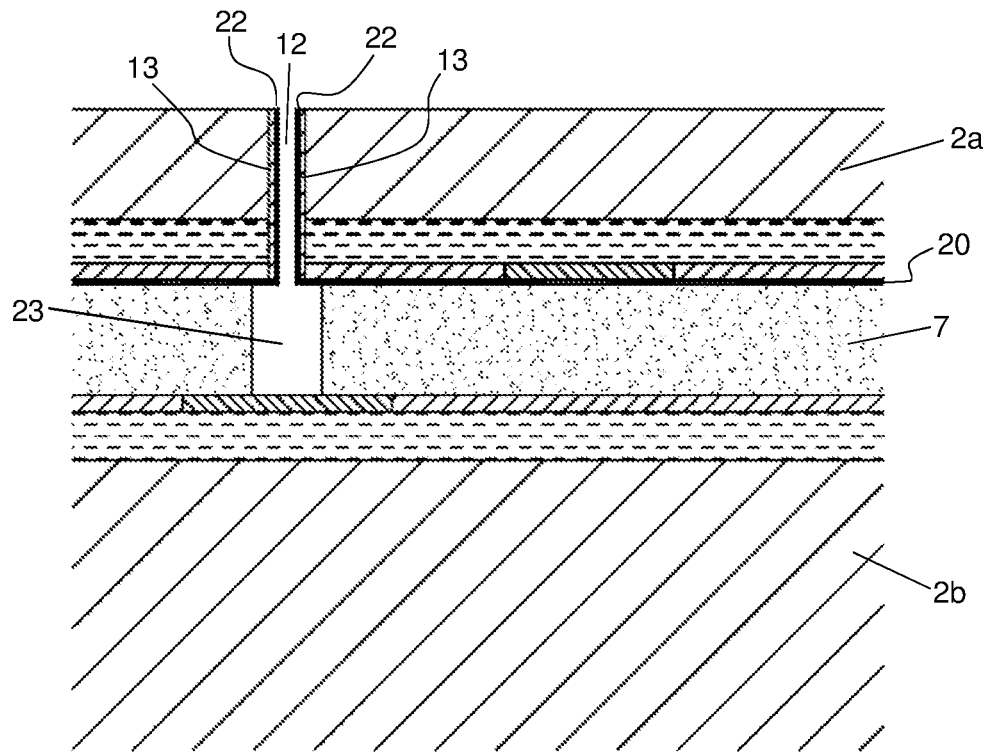
Figure 3E:
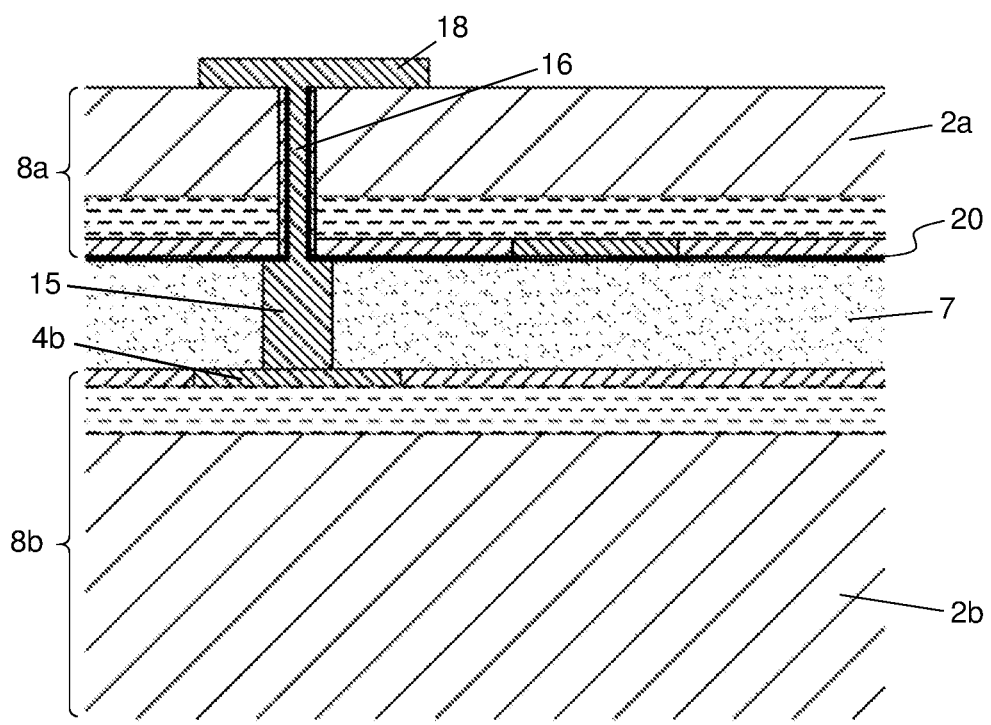

A second embodiment of the method is illustrated in FIGS. 3A to 3E. The same wafers 1a and 1b are being bonded by HSQ bonding layers 6a and 6b, but an additional dielectric layer 20 is formed on the upper substrate 2a before bonding, as seen in FIG. 3A. This may be a SiN layer, for reasons described further in this paragraph. The HSQ bonding layer 6a is applied on top of the SiN layer 20. The steps of bonding and thinning the upper substrate 2a are the same as described for the first embodiment. However, as seen in FIG. 3B, an e-beam 10 is now scanned across a full circular area (or another shape, the circular shape is not a limitation to the embodiments), transforming the HSQ material into silicon oxide so as to form a solid oxide shape 21 that spans across the full thickness of the HSQ bond layer 7, and that overlies a conductor 4b in the lower substrate 2b. The via opening 12 is etched above the oxide shape 21 (see FIG. 3C), and the liner 13 is formed on the sidewalls and removed from the bottom of the via opening as in the first embodiment. Again, the via opening 12 need not be concentric with the shape 21. It is sufficient in this case that the cross-section of the via opening 12 at least partially overlaps the cross-section of the shape 21. An additional SiN liner 22 is then formed on the first liner 13, for example by plasma-enhanced atomic layer deposition, possibly according to a similar process as applied for the formation of the first liner 13, i.e. deposition of SiN on the sidewalls and bottom of the via opening and removal of SiN from the bottom. Then, as seen in FIG. 3D the silicon oxide shape 21 is removed by an etching process, for example a $C_4F_8$ based plasma etch, that removes the silicon oxide selectively with respect to the HSQ 7 and the SiN 20+22. The function of the SiN layers is precisely to protect the liner 13 and the dielectric layer 5a from being attacked by this etch process. The result is again a cavity 23 connected to the upper surface of the stack by the via opening 12. The cavity 23 and the via opening 12 are then filled with an electrically conductive material, as illustrated in FIG. 3E, again forming the pillar 15, via connection 16 and contact pad 18. The result is again a stack of two semiconductor chips 8a and 8b of which a small portion is shown in FIG. 3E. The chips are bonded by an HSQ bond layer 7, wherein at least one electrically conductive pillar 15 extends between the two adjacent chips 8a and 8b of the stack, and wherein said pillar 15 is embedded in and in direct contact with the bond layer 7 formed between said adjacent chips. The SiN layer 20 and the additional SiN liner 22 may be omitted if the material of the liner 13 and of the dielectric layer 5a are themselves resistant to the etch process used for removing the silicon oxide of the shape 21.

Figure 4:
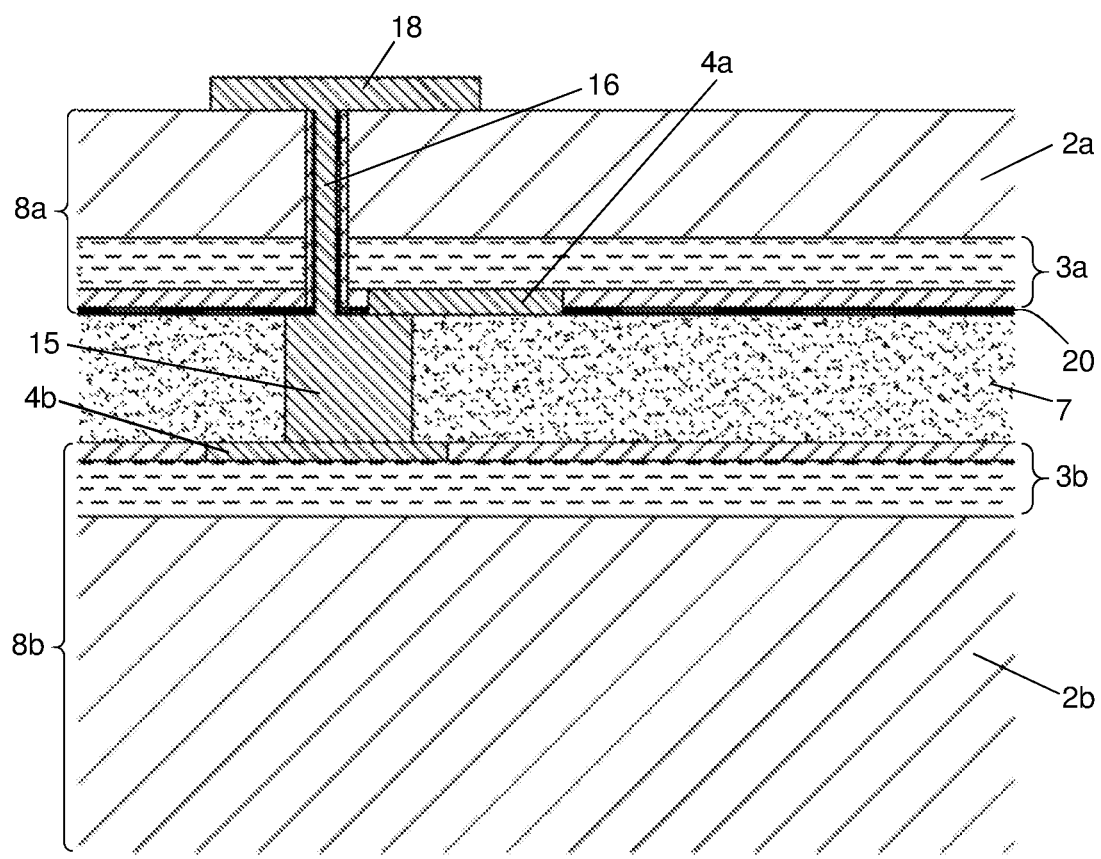
FIG. 4 illustrates the result of the method of the second embodiment applied to a case where two conductors in the back end of line of the two bonded chips are to be connected directly.

FIG. 4 illustrates how the same process allows to form a contact to both the upper and the lower chip of a stack, by irradiating an area that overlaps a conductor 4a on the upper substrate 2a as well as a conductor 4b on the lower substrate 2b.

In any of the above-described embodiments, the HSQ (or equivalent) bond layer 7 may be maintained as the final bond layer between the wafers of the stack, as is the case in the process illustrated in the drawings. Alternatively the HSQ bond layer 7 may be transformed in its entirety into silicon oxide, after the formation of the cavity 14 or 23, by a thermal anneal, for example at a temperature of about 420° C. Whether this step is included or not may depend on the thermal budget of later process steps. When the HSQ or its equivalent is not transformed by a thermal anneal, the stack of semiconductor chips obtained by the method of the embodiments is characterized by the presence of the pillar 15 between adjacent chips, and embedded in a bond layer of HSQ or equivalent material. When the stack is obtained by the method of the first embodiment, the pillar is separated from the HSQ bond layer 7 by the silicon oxide closed wall 11 (as in FIGS. 1H and 2). When obtained by the method according to the second embodiment, the pillar 15 is in direct contact with the surrounding HSQ bond layer 7 (as in FIGS. 3E and 4).

In the above-described process flow, thinning of the first substrate 2a is done after bonding. Alternatively, the substrate 2a could be thinned before bonding, by first temporarily bonding the wafer 1a to an auxiliary support wafer and thinning the wafer 1a (and thereby the substrate 2a) while it is temporarily attached thereto. The thinned wafer is then bonded to the second wafer 1b and the above-described process is pursued.

An HSQ or equivalent bonding layer is preferably applied on both of the surfaces that are to bonded, as was the case for the above-described embodiments (bonding layers 6a and 6b). The embodiments are, however, also applicable when an HSQ or equivalent bonding layer is applied to only one of the two surfaces which are to be bonded. For example, in the embodiments described above, the lower HSQ layer 6b may be omitted, so that the lower bonding surface is formed by the dielectric layer 5b having conductors 4b embedded therein. The bond layer 7 obtained after bonding and annealing is then formed by the single HSQ bonding layer 6a, and the methods as described above can be applied as such. The bonding then no longer qualifies as 'dielectric' bonding, but rather as a form of hybrid bonding with a continuous dielectric layer on one side of the interface and a layer comprising both metal and dielectric on the other side. This embodiment may therefore still suffer from the misalignment and other problems occurring in hybrid bonding. However, as long as these issues are kept under control, the embodiments are perfectly applicable in this case.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

As used in the claims below and throughout this disclosure, by the phrase "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

Unless specifically specified, the description of a layer being present, deposited or produced 'on' another layer or substrate, includes the options of
- said layer being present, produced or deposited directly on, i.e. in physical contact with, said other layer or substrate, and
- said layer being present, produced or deposited on one or a stack of intermediate layers between said layer and said other layer or substrate.

What is claimed is:

1. A method of bonding a first semiconductor chip on a first substrate to a second semiconductor chip on a second substrate, comprising:
    providing a bonding layer on at least one of the first substrate and the second substrate, the bonding layer being formed of a dielectric bonding material, wherein the dielectric material is Hydrogen Silsesquioxane (HSQ), or an equivalent thereof;

bonding the first substrate to the second substrate and performing a thermal annealing, so as to obtain a stack of the substrates with a bond layer between the first substrate and the second substrate, wherein the first substrate is thinned either before or after the bonding, and wherein the thermal annealing takes place at a temperature below a temperature at which the dielectric bonding material transforms into silicon oxide;

after bonding, scanning an electron beam across an area of the thinned first substrate, an energy of the electron beam being sufficient for the electron beam to reach the bond layer and to transform the scanned dielectric bonding material of the bond layer into a silicon oxide, to thereby obtain a volume of the bond layer that is transformed into a silicon oxide, wherein the volume is essentially a closed wall extending over a full thickness of the bond layer, and enclosing a volume of bonding material, thereby separating that volume of bonding material from the rest of the bond layer;

etching a via opening through the thinned first substrate until reaching an interior of the closed wall, and a dielectric liner is formed on sidewalls of the via opening;

through the via opening, removing the dielectric bonding material from the interior of the closed wall, selectively with respect to the silicon oxide, so as to create a cavity in the bond layer and expose a conductor in the second substrate; and filling the cavity and the via opening with an electrically conductive material, to thereby form an electrical connection that connects the conductor in the second substrate to a conductor present in the first substrate and/or to a contact present on top of the stack.

2. The method of claim 1, wherein after the removal of the dielectric bonding material from the interior of the closed wall, the stack is subjected to an additional thermal annealing at a temperature at or above the temperature at which the dielectric bonding material of the bond layer transforms into silicon oxide, to thereby transform the entire bond layer into silicon oxide.

3. The method of claim 1, wherein a first bonding layer is provided on the first substrate and a second bonding layer is provided on the second substrate, and wherein the bond layer comprises a dielectric bonding layer obtained by bringing the first bonding layer and the second bonding layer into physical contact, followed by the thermal annealing.

4. A method of bonding a first semiconductor chip on a first substrate to a second semiconductor chip on a second substrate, comprising:

providing a bonding layer on at least one of the first substrate and the second substrate, the bonding layer being formed of a dielectric material, wherein the dielectric material is Hydrogen Silsesquioxane (HSQ), or an equivalent thereof, bonding the first substrate to the second substrate, and performing a thermal annealing, so as to obtain a stack of the first substrate and the second substrate with a bond layer between the first substrate and the second substrate, wherein the first substrate is thinned either before or after the bonding, and wherein the thermal annealing takes place at a temperature below a temperature at which the dielectric material transforms into silicon oxide, after bonding, scanning an electron beam across an area of the thinned first substrate, an energy of the electron beam being sufficient for the electron beam to reach the bond layer and to transform the dielectric material of the bond layer into a silicon oxide, to thereby obtain a volume of the bond layer that is transformed into a silicon oxide, wherein the volume is a solid shape extending over a full thickness of the bond layer;

etching a via opening through the thinned first substrate until reaching the solid shape, and forming a dielectric liner on the sidewalls of the via opening;

removing, through the via opening, the silicon oxide of the solid shape selectively with respect to the dielectric material, so as to create a cavity in the bond layer and expose a conductor in the second substrate; and filling the cavity and the via opening with an electrically conductive material, to thereby form an electrical connection that connects the conductor in the second substrate to a conductor in the first substrate and/or to a contact on top of the stack.

5. The method of claim 4, wherein after the removal of the silicon oxide of the solid shape, the stack is subjected to an additional thermal annealing at a temperature at or above the temperature at which the dielectric material of the bond layer transforms into silicon oxide, to thereby transform the entire bond layer into silicon oxide.

6. The method of claim 4, further comprising applying a continuous layer onto the first substrate prior to applying the bonding layer to the first substrate, wherein an additional liner is applied on top of the dielectric liner inside the via opening, and wherein a material of the continuous layer and of the additional liner is resistant to an etch process used to remove the silicon oxide of the solid shape.

7. The method of claim 6, wherein the continuous layer and the additional liner are formed of silicon nitride.

8. A stack of two or more semiconductor chips bonded by a bond layer consisting of Hydrogen Silsesquioxane (HSQ), or an equivalent thereof, wherein at least one electrically conductive pillar extends between two adjacent semiconductor chips of the stack, wherein the pillar is embedded in the bond layer formed between the two adjacent semiconductor chips, wherein individual ones of the semiconductor chips comprise an electrical conductor embedded in a respective dielectric layer, and wherein the stack further comprises a via connection extending from the top of a first semiconductor chip, through the dielectric layer of the first semiconductor chip, and partially overlapping the conductive pillar to connect the top of the first semiconductor chip to the electrical conductor of a second semiconductor chip.

9. The stack of chips of claim 8, wherein the electrically conductive pillar forms an interior of a closed silicon oxide wall extending between the two adjacent semiconductor chips, the closed silicon oxide wall separating the bond layer from the electrically conductive pillar.

10. The stack of chips of claim 8, wherein the electrically conductive pillar is in direct contact with the bond layer.

* * * * *